United States Patent [19]

Spohr

[11] Patent Number: 4,668,957
[45] Date of Patent: May 26, 1987

[54] AMORPHOUS GLASS MATRIX CONTAINING ALIGNED MICROSCOPICALLY THIN METAL CONDUCTORS

[75] Inventor: Reimar Spohr, Darmstadt, Fed. Rep. of Germany

[73] Assignee: Gesellschaft für Schwerionenforschung mbH Darmstadt, Darmstadt, Fed. Rep. of Germany

[21] Appl. No.: 660,203

[22] Filed: Oct. 12, 1984

[30] Foreign Application Priority Data

Oct. 12, 1983 [DE] Fed. Rep. of Germany ....... 3337049

[51] Int. Cl.⁴ .................. H01B 1/22; H01Q 15/10; H01Q 21/12
[52] U.S. Cl. .................... 343/812; 343/909; 252/514; 501/19; 339/DIG. 3
[58] Field of Search .................. 252/514; 501/19, 54; 339/DIG. 3; 343/812, 756, 911 R, 909

[56] References Cited

U.S. PATENT DOCUMENTS

| | | | |
|---|---|---|---|
| 2,457,158 | 12/1948 | Koch | 501/19 |
| 2,736,894 | 2/1956 | Kock | 343/911 R |
| 3,165,750 | 1/1965 | Tell | 343/911 R |
| 3,303,085 | 2/1967 | Price et al. | 161/109 |
| 3,771,160 | 11/1973 | Laverick | 343/756 |
| 4,113,981 | 9/1978 | Fujita et al. | 174/88 R |
| 4,203,088 | 5/1980 | Sado et al. | 338/114 |
| 4,338,164 | 7/1982 | Spohr | 204/4 |
| 4,369,370 | 1/1983 | Spohr | 378/160 |
| 4,449,774 | 5/1984 | Takashi et al. | 339/DIG. 3 |
| 4,479,128 | 10/1984 | Brunner et al. | 343/756 |

*Primary Examiner*—Eli Lieberman
*Attorney, Agent, or Firm*—Spencer & Frank

[57] ABSTRACT

The invention comprises a solid material that is an electrical conductor in a single direction which comprises an amorphous glass matrix containing a plurality of microscopically thin metal filaments, all of which are oriented in the direction of conductivity and extend to or near the surfaces of the solid material. This directionally conducting material is produced by subjecting a metastable glass supersaturated with metal to directed ionic radiation. On irradiation parallel microscopic holes or pores are formed which become filled with molten metal during tempering, which cool to form metallic dipole filaments. The thickness of the material and the angle of irradiation may be selected to produce dipole filaments of lengths appropriate to act as antennas for electromagnetic radiation of wavelengths from less than about 0.1 micron to about 1 mm. The direction of conductivity, i.e., the direction of the metal filaments, may be at any predetermined angle to the surface of the solid material controlled by the direction of irradiation.

10 Claims, 1 Drawing Figure

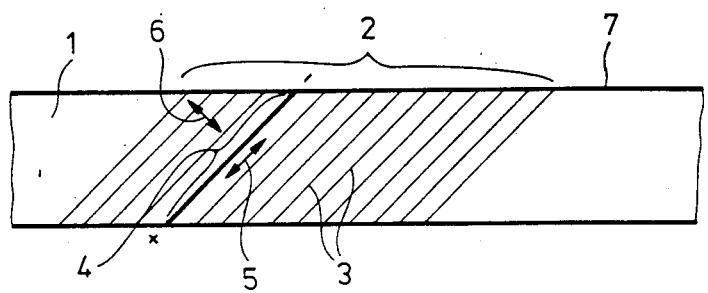

AMORPHOUS GLASS MATRIX CONTAINING ALIGNED MICROSCOPICALLY THIN METAL CONDUCTORS

BACKGROUND OF THE INVENTION

The present invention relates to a solid material or to a body of solid material of preferably a planar or flat geometry having unique electrical properties relating to directional conductivity and high frequency electromagnetic radiation resonance. The present invention generally relates to the effect of heavy ion radiation on solids and to the nuclear traces, or microholes, formed in the homogeneous structure of a solid insulating material along the paths of high energy ions by such radiation treatment which can be used to initiate phase conversion process.

SUMMARY OF THE INVENTION

It is now the object of the present invention to provide a novel solid material with unique electrical properties. In particular, the material of this invention is electrically conductive in one direction but acts as an insulator in directions not parallel thereto. Also included in the invention is a method for making the novel solid material. With this solid material, or with a solid body of a finite thickness produced therefrom, it is possible, inter alia, to positively generate, deflect, and detect electromagnetic radiation of wavelengths between less than 0.1 micron and about 1 mm, which previously could only be performed with difficulty.

BRIEF DESCRIPTION OF THE DRAWING

The FIGURE is a schematic side view of a portion of a flat solid body according to the invention wherein radiation formed pores and one metal dipole formed therein are shown.

DETAILED DESCRIPTION OF THE INVENTION

The present invention now proposes to accomplish the detection, deflection, and generation of electromagnetic radiation by offering a solid material or body of solid material having non-isotropic electrical properties which is characterized by being electrically conductive in one direction while being electrically insulating in the direction perpendicular thereto.

The solid material according to the invention is preferably formed into a solid body of finite thickness, i.e., $\leq 0.1$ μm up to about 1 mm of a planar or flat geometry, which comprises a matrix of dielectric material containing a plurality of dipoles of electrically conductive material disposed within the matrix such that they are axially parallel and the ends of the dipoles extend to, or at least near to, the upper and lower surfaces of the solid body. The diameter of the electrically conductive dipoles is in the microscopic range.

The solid material according t the invention is preferably comprised of a metastable glass which is supersaturated with at least one metal or metal alloy.

A preferred embodiment of a solid material according to the invention is a glass matrix which contains 1 to 40% of a noble metal such as copper, silver or gold. The glass matrix may be made from glass, i.e., normal glass: soda lime glass as, e.g. 70% $SiO_2$ + 15% $CaO$ + 15% $Na_2O$ by weight, and quartz glass: 100% $SiO_2$ The novel solid material according to the invention is produced by first preparing a slab of insulating material such as glass that is supersaturated with metal by conventional methods, or for example, by ion sputtering, by precipitation from the gas phase or by simultaneous vapor deposition of a layer of a metal and glass, such as copper, silver or gold and silicon dioxide. The slab is irradiated with heavy ions of a predetermined energy at an angle to its surface, for example, perpendicular to its surface or at grazing incidence, to produce nuclear tracks. The slab may be irradiated with a heavy ion dosage, for example, $10^{11}/cm^2$, using, for example, uranium, lead or xenon. One method for producing microholes by irradiation is disclosed in U.S. Pat. Nos. 3,303,085 and 4,338,164 more appropriate (the author R Sp), which is included by reference. The metallic filaments may form spontaneously or the slab is tempered until the metal aggregates to form metallic filaments, for example, in a temperature range of from room temperature to 400° C.

It is envisioned also that the material may be layered or supported on a substrate of some kind. In this way very thin films may be generated having the claimed anisotropic properties.

The novel solid material has the advantage, in addition to its special characteristics with respect to conductivity, of containing a plurality of oriented metallic dipoles in microscale which have the characteristics of antenna with respect to the aforementioned electromagnetic radiation. The spacing of the dipoles can be very large relative to the thickness of the atomic dipoles. In insulators, the precipitation of metal aggregates along the parallel pores formed by nuclear radiation produces a plurality of parallel oriented dipole antennas in the form of fine, electrically conductive metal needles. Along the anisotropic axes defined by the nuclear traces, such a composite material has an extraordinarily high dielectric constant, comparable to the dielectric constant of metals. However, transverse to the anisotropic axis, i.e., at an angle not in line with the parallel dipoles, the dielectric constant is practically unchanged from that of the original insulating material. The electromagnetic absorption and emission characteristics of such a well oriented antenna ensemble are novel and serve advantageous purposes. Uses for the material of the invention as an "antenna ensemble" include: generator, deflector, absorber, reflector, detector for electromagnetic radiation.

Details of the novel solid material and solid body, respectively, will be explained in greater detail with the aid of the FIGURE.

The sole FIGURE is a sectional view of a flat solid body of a planar layer arrangement whose basic material 1 is, for example, a copper, silver or gold supersaturated quartz glass. It is important in this connection, that a metastable system exists which tends to demix. However, the material must be a metastable system e.g. a glass, because during stabilization a demixing process would have taken place which would have destroyed the desired characteristics. A certain region 2 of the solid body has been irradiated with high energy heavy ions, for example $10^{10}$ ions per $cm^2$ of uranium, lead or xenon. In the illustrated embodiment the irradiation took place at an angle of 45° with respect to the surface, thus producing the latent nuclear traces 3. After irradiation, the solid body either spontaneously forms contingent metallic needles or it is subjected to a tempering process until the nuclear traces 3 and the metal aggregations resulting from the irradiation and following the direction of the nuclear traces have merged to form metallic filaments. This occurs in a temperature ranging from room temperature to about 400° C. Thus, electrically conductive filaments having a microscopic diameter within the same order of magnitude as that of microholes produced by irradiation of the matrix with nuclear radiation from a high energy ion source are produced.

The resulting material has special characteristics; a plurality of dipoles 4 have been produced in the direction of nuclear traces 3 (one is shown by a thicker line). These dipoles have a high degree of electrical polarization resulting, in the one direction 5, in very high, practically metallic conductivity with high polarizability and, in the other direction 6 perpendicular thereto, in negligible conductivity or a high insulating effect. Thus, electron mobility in directions 5 and 6 differs considerably from one another. Direction 5, the dipole direction, may be perpendicular or at any angle to surface 7 of the solid material, i.e. the direction of irradiation can be selected at will.

A novel anisotropic insulator material is thus produced which has a very high, practically metallic, dielectric constant in one preferred direction. The type of metal precipitated, the preferred direction of conductivity, and the length of the metallic dipole antennas are selectable. It is also possible to produce embedded metal antennas with this invention.

The basic principle of the present novel solid material is that, in a dielectric matrix, noble metals, dissolved out at high temperatures, exhibit strong tendencies to merge in the form of metallic aggregates. This aggregation process is actuated by the passage of one or a plurality of highly ionized ions. It ends in an arrangement of metallic aggregations along the ion track.

In the above-described manner, the present invention produces metallic needles, e.g. oriented microscopic dipole antennas of identical length, in the solid body. Along a preferred axis of anisotropy, such a composite material has an extraordinarily high dielectric constant at low frequencies. However, at 90° to the dipole axis, the constant, as already described, remains very low. At high frequencies, the resonant absorption or the emission of electromagnetic radiation through such a well-oriented system of dipole antennas points up further novel and important characteristics of the material. "high dielectric constant" means "a dielectric constant approaching that of a metal". "low dielectric constant" means "a dielectric constant approaching that of the glassy matrix". "high frequencies" means "frequencies approaching frequencies of infrared or visible light". "low frequencies" means "frequencies below for example radio frequencies".

The embodiments described above are presented for purposes of illustrating the invention only. It is conceived that many equivalences, variations, adaptations and modifications may be made without departing from the invention which is defined by the scope of the claims set forth below.

What is claimed is:

1. A solid material comprising:
    a matrix comprised of a metastable dielectric material which is supersaturated with at least one metal or metal alloy and exhibits a strong tendency to aggregate as metallic filaments of said at least one metal or metal alloy therewithin when irradiated with nuclear radiation from a heavy ion source whereby a plurality of microholes having longitudinal axes which are parallel to one another are generated in said matrix and into which said metallic filaments aggregate; and;
    a plurality of electrically conductive metallic filaments comprised of said at least one metal or metal alloy and provided in said matrix by irradiation thereof with nuclear radiation from a heavy ion source, said metallic filaments having axes which are parallel to one another and having a microscopic diameter corresponding to that of said plurality of microholes,
    said solid material having the characteristics of being electrically conductive in one direction, which one direction is parallel to the axes of said metallic filaments, and being electrically insulating at least in every direction perpendicular to the one direction.

2. The solid material of claim 1 having a high electrical conductivity in said one direction, which high conductivity is comparable to that of a metal, and a low electrical conductivity at least in every direction perpendicular to said one direction, which low conductivity is comparable to that of an electrical insulator.

3. The solid material of claim 1 shaped as a solid body having upper and lower surfaces, wherein the ends of said metallic filaments extend to the vicinity of at least one of said surfaces of the solid body, and wherein said metallic filaments are oriented non-parallel to said surfaces.

4. The solid material of Claim 3, wherein said metallic filaments are of lengths to effectively resonate and act as dipole antennas for electromagnetic radiation of a wavelength in the range of from about 0.1 micron to about 1 mm.

5. The solid material of claim 1, wherein said metastable dielectric material is a metastable glass which is a glass which is supersaturated with at least one metal or metal alloy.

6. The solid material of claim 5, wherein the glass is one of a normal glass and a quartz glass, and the metastable glass contains from 1 to 40% of a noble metal selected from the group consisting of copper, silver and gold 7. A solid material having the characteristics of being electrically conductive in one direction and being electrically insulating at least in every direction perpendicular to the one direction, being shaped as a solid body having upper and lower surfaces, and comprising:
    a matrix comprised of a metastable dielectric material which is supersaturated with at least one metal or metal alloy and exhibits a strong tendency to aggregate metallic filaments of said at least one metal or metal alloy therewithin when irradiated with nuclear radiation from a heavy ion source whereby a plurality of microholes having longitudinal axes which are parallel to one another are generated in said matrix and into which said metallic filaments aggregate; and
    a plurality of electrically conductive metallic filaments comprised of said at least one metal or metal alloy and provided in said matrix by irradiation thereof with nuclear radiation from a heavy ion source, said metallic filaments having axes which are parallel to one another and having a microscopic diameter corresponding to that of said plurality of microholes, wherein the ends of said metallic filaments extend to the vicinity of at least one of said surfaces of the solid body, wherein said metallic filaments are oriented non-parallel to said surfaces, and wherein said one direction is parallel to the axes of said metallic filaments.

8. The solid material of claim 7, wherein said metallic filaments are of lengths to effectively resonate and act as dipole antennas for electromagnetic radiation of a wavelength in the range of from about 0.1 micron to about 1 mm.

9. The solid material of claim 7, wherein said metastable dielectric material is a metastable glass which is a glass which is supersaturated with at least one metal or metal alloy.

10. The solid material of claim 9, wherein the glass is one of a normal glass and a quartz glass, and the metastable glass contains from 1 to 40% of a noble metal selected from the group consisting of copper, silver and gold.

* * * * *